United States Patent [19]

Ohashi et al.

[11] Patent Number: 4,792,988
[45] Date of Patent: Dec. 20, 1988

[54] RADIO RECEIVING CIRCUIT WITH A SEARCH TUNING MECHANISM

[75] Inventors: Tamaki Ohashi, Tokyo; Toshiyuki Matsuda, Kawasaki, both of Japan

[73] Assignee: Nihon Technical Kabushiki Kaisha, Tokyo, Japan

[21] Appl. No.: 31,949

[22] Filed: Mar. 27, 1987

[30] Foreign Application Priority Data

Mar. 28, 1986 [JP] Japan .................... 61-68480

[51] Int. Cl.⁴ ............ H04B 11/32; H04B 11/16
[52] U.S. Cl. .................... 455/162; 455/163; 455/172; 455/164
[58] Field of Search ........... 455/161, 162, 163, 164, 455/170, 172

[56] References Cited

U.S. PATENT DOCUMENTS

| | | | |
|---|---|---|---|
| 2,885,546 | 5/1959 | Taylor et al. | 455/162 |
| 3,553,379 | 1/1971 | Boomgaard | 455/162 |
| 3,715,495 | 2/1973 | Takezaki et al. | 455/162 |
| 3,968,442 | 7/1976 | Garskamp | 455/162 |
| 4,389,732 | 6/1983 | Sasahara et al. | 455/162 |

FOREIGN PATENT DOCUMENTS 0104688  4/1984  European Pat. Off. ......... 455/162
56-46322  4/1981  Japan ......................... 455/162
58-70623  4/1983  Japan ......................... 455/162

*Primary Examiner*—Robert L. Griffin
*Assistant Examiner*—Ralph E. Smith
*Attorney, Agent, or Firm*—Bruce L. Adams; Van C. Wilks

[57] ABSTRACT

A radio receiving circuit provided with a search tuning mechanism. A broadcasting radiowave signal is received during a search tuning operation, and a shift amount of frequency produced in frequency of an intermediate frequency amplifier output is experimentally determined within an inertia self-travelling time interval search tuning mechanism due to the mechanical inertia thereof from the moment at which a drive force applied to the search tuning mechanism is interrupted to the time when the mechanism temporarily positively stops its function. The drive force applied to the search tuning mechanism is interrupted at a frequency deviated by the shift amount in advance from a center frequency of a pass band width of the intermediate frequency amplifier circuit, whereby after the mechanism has self-travelled due to its own mechanical inertia force and when tuned to the center frequency of the received radiowave signal, the search tuning operation is suspended.

14 Claims, 2 Drawing Sheets

RADIO RECEIVING CIRCUIT WITH A SEARCH TUNING MECHANISM

FIELD AND BACKGROUND OF THE INVENTION

The present invention particularly relates to an automotive radio receiving circuit with a search tuning mechanism suitable for use in a vehicle.

Heretofore, a radio receiving circuit with a search tuning mechanism has been well known, in which a motor is started to continuously vary variable tuning elements to tune them to the incoming broadcasting radiowave signal. The conventional search tuning operation has been carried out in the procedure such that when the arrival of an output level of an intermediate frequency signal from an intermediate frequency amplifier relative to a predetermined value is detected, a trigger pulse is provided by which pulse the search tuning operation is interrupted.

However, according to the above-mentioned search tuning system, a significant deviation in time of producing a trigger pulse occurs according to the magnitude of the electric field strength possessed by the incoming radiowave signal fed to the radio receiving circuit, and consequently, the search tuning operation is interrupted at a frequency deviated from the center frequency of the incoming radiowave signal and the condition becomes sometimes locked to the receiving state, which is very inconvenient.

That is, for example, in the case where the output level from the intermediate frequency amplifier which produces a trigger pulse is set to a low level in advance, when a receiving radiowave signal from a certain broadcasting station is subject to search tuning operation within an area where the electric field strength is extremely great, a trigger pulse is produced at a frequency greatly deviated from the center frequency of the receiving radiowave signal to select the station. Therefore, even if the same radiowave signal is received, the same signal cannot be received when the vehicle has moved to another area where the electric field strength is small, and the search tuning operation must be carried out again or erroneous tuning due to a field noise unexpectedly occurs during the search tuning operation, thus sometimes disadvantageously interrupting the operation. Conversely, in the case where the output level of the intermediate frequency which produces a trigger pulse is set to a high level in advance, there is an inconvenience that in the area where the electric field strength of the radiowave signal which one desires to receive, the desired station cannot be selected.

SUMMARY OF THE INVENTION

Unlike the aforementioned prior art, the search tuning mechanism according to the present invention which can be operated without relying upon the electric field strength of the incoming radiowave signal is designed so that a drive system is disconnected from the search tuning mechanism at a frequency deviated by a given frequency width experimentally determined for respective broadcasting systems from the center frequency of receiving radiowave signals, i.e., receiving radio frequency signals, according to various broadcasting systems such as AM, FM, in consideration of mechanical inertia possessed by the search tuning mechanism, whereby the mechanism is decelerated after the suspension of drive so that the search tuning mechanism further self-runs during the time interval corresponding to the aforementioned frequency width by means of its own mechanical inertia while being declerated. Thereafter, the mechanism stops exactly at the center frequency of the receiving radiowave signal. The aforesaid given frequency width is the amount of variation of frequency produced within the time interval (defined as an inertia travelling time interval) required from the time when the search tuning mechanism loses its own mechanical intertia force and positively stops at the moment when the drive system thereof is interrupted to the time when the tuning operation is temporarily suspended. This amount of variation is decided through may times of experiments according to various broadcasting systems such as AM mode, FM mode, LW mode, etc. According to the present invention, these deviations of the frequency widths are anticipated in advance, and operation for suspending the tuning operation at the center frequency of the respective recieving radiowave signal, that is, operation for disconnecting the drive system from the search tuning mechanism is thus carried out.

As described above, the present invention does not rely on the electric field strength of the incoming radiowave signal but the mechanical inertia possessed by the search tuning mechanism is taken into consideration so that the drive system of the turning mechanism is disconnected through the oeration of the clutch. With this, the present invention has the advantage that selecting a station can be achieved at a position very close to the center frequency of the receiving radiowave signal to thereby provide products with extremely high precision of station-selection.

DESCRIPTION OF THE PREFERRED EMBODIMENT

Figure 1:
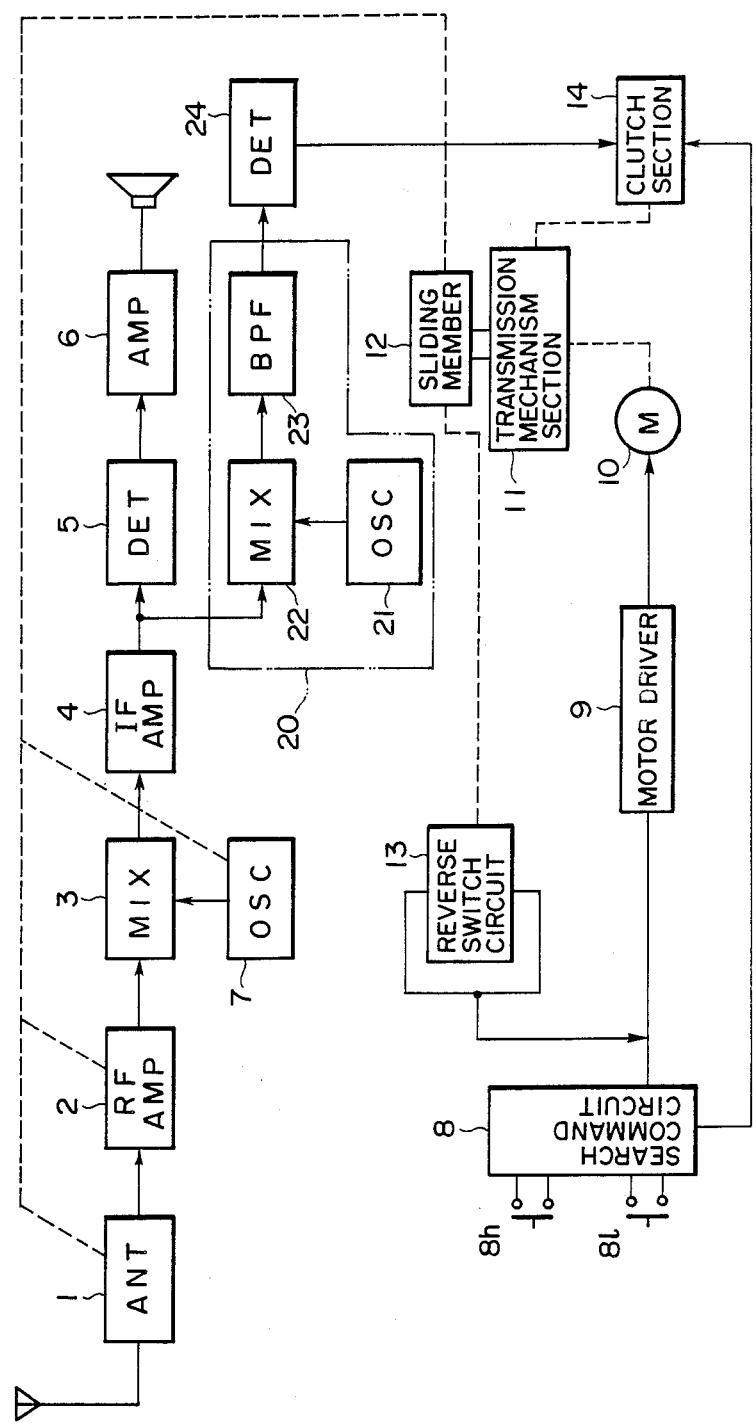
FIG. 1 is a block diagram showing the construction of an embodiment according to the present invention.

The embodiment according to the present invention will now be described in detail with reference to the drawings. FIG. 1 is a block diagram showing a schematic structure of the present invention, in which an antenna circuit 1, an RF amplifer circuit 2, a mixing circuit 3, an IF amplifer circuit 4, a detector circuit 5, a voice amplifier circuit 6 and a local oscillator circuit 7 constitute a radio receiving circuit according to a known system.

Further, a search command circuit 8 having two start buttons 8h, 8l for selecting and determining the searching direction of search tuning operation, a transmission mechanism section 11 for continuously moving or shifting, by driving a motor 10, a sliding member 12 which operatively supports variable tuning elements scatteringly included in a motor driver 9 which selects and determines the running direction of a motor 10 in response to a command signal from the search command circuit 8, the antenna circuit 1, the RF amplifier circuit 2 and the local oscillator circuit 7, respectively, a reverse switch circuit 13 which reacts with the sliding member 12 to switch the running mode of the motor 10 when the variable tuning elements have reached their variable threshold value due to the movement of the sliding member 12 driven by the transmission mechanism section 11, and a clutch section 14 which effects the tuning of the broadcasting radiowave signal from a certain broadcasting station in response to a control signal like the aforementioned trigger pulse to interrupt the drive force applied to the transmission mechanism section 11, constitute a known search tuning mechanism.

In the present invention, in addition to the structure of a radio receiver set with the known search tuning mechanism as described above, a control circuit 20 is connected to the IF amplifier circuit 4 of the aforesaid radio receiving circuit, the control circuit 20 comprising a local oscillator circuit 21 for producing a reference signal oscillating at the center frequency of the intermediate frequency band, a mixing circuit 22 for mixing the output of the oscillation circuit 21 and the output of the IF amplifier circuit 4 in the radio receiving circuit, and a band path filter, for example, preferably an adjustable setting circuit 23 for receiving an output having a frequency stepped down by the mixing circuit 22 and setting the deviation width of frequency produced in the intermediate frequency band corresponding to the inertia travelling time interval of the search tuning mechanism, that is, the time interval required from the time when the drive force of the transmission mechanism section 11 is interrupted by the operation of the clutch section 14 to the time when the mechanical inertia force of the search tuning mechanism completely disappears by dynamic frictional resistance received by the search tuning mechanism from various parts in sliding contact therewith and the variable tuning elements positively stop their variations. An output signal having frequency equal to the deviation width of the aforesaid frequency is outputted from the control circuit 20, and the output signal is detected by means of a detector circuit 24, and thereafter the clutch section 14 is controlled. For the circuit structures of the local oscillator circuit 21, the mixing circuit 22 and the detector circuit 24, an IC of the type produced by SANYO ELECTRIC CO., LTD. is used, for example, in an AM radio receiving circuit. It should be noted however that any other IC having a similar function may also be used.

Now, when the deviation width of frequency in the intermediate frequency band corresponding to the inertia travelling time interval possessed by the search tuning mechanism designed as mentioned above, or the amount of variation of frequency, is set to 1 KHz in the AM radio receiving circuit, the received broadcasting radiowave signal is catched by the antenna circuit 1 and the received radio frequency signal is amplified by the RF amplifier circuit 2, during the time when the receiving circuit completely catches the broadcasting radiowave signal for a cetain station. Thereafter, the thus amplified signal is converted in frequency into the intermediate frequency signal by the mixing circuit 3 and the local oscillator circuit 7 and amplified by the IF amplifier circuit 4 and outputted. However, when the frequency of the intermediate frequency signal is scanned toward the center frequency 455 KHz, for instance, of the pass band width of the IF amplifier circuit 4 and approaches to the center frequency from either one of upper or lower side thereof and the frequency reaches 454 or 456 KHz, the output signal frequency from the mixing circuit 22 in the control circuit 20 becomes 1 KHz, output of which passes the pass frequency band of the setting circuit 23 and is detected by the detector circuit 24 and thereafter the clutch section 14 is controlled whereby the drive system of the transmission mechanism section 11 is disconnected from the clutch tuning mechanism. Then, the variable tuning elements self-run through the time interval corresponding to the amount of variation of frequency, approximately 1 KHz, and then stop. Consequently, the selection of a station can be achieved at a frequency very close to the center frequency of the incoming radiowave signal.

It is to be noted that in setting the amount of variation in frequency caused by the self-travelling and variation of the variable tuning elements to 1 KHz in the AM radio receiving circuit during the intertia travelling time interval effected by the aforementioned search tuning mechanism, results of experiments conducted several times where a normal search tuning mechanism is used is taken into consideration.

Preferably, the set value of the amount of variation in frequency is approximately 15 KHz in the FM radio receiving circuit, and approximately 250 Hz in the LW radio receiving circuit.

Figure 2:
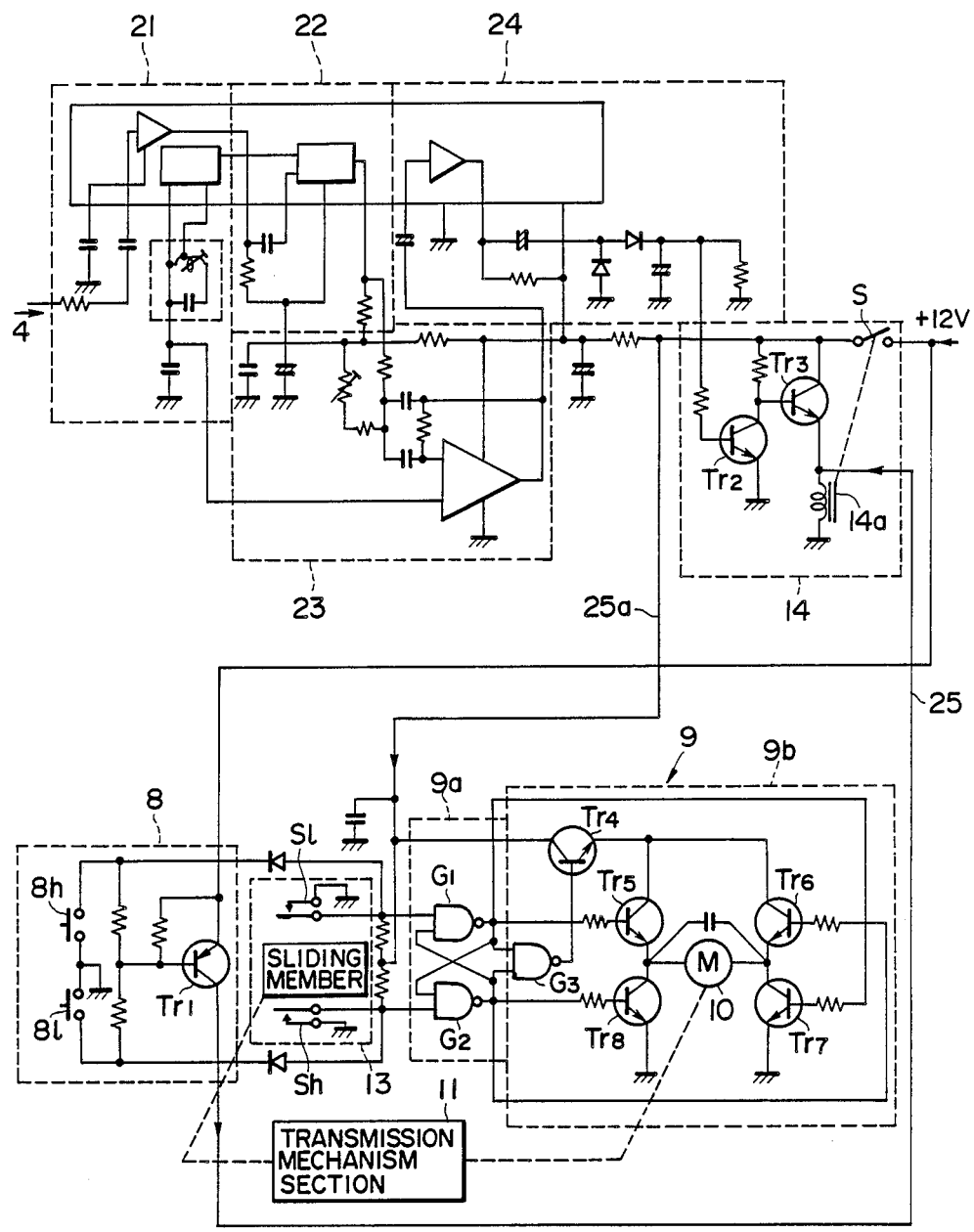
FIG. 2 is a circuit representation of essential parts of the embodiment.

FIG. 2 shows a detailed electric circuit of the present invention in which an erroneous operation protective function is applied to the search tuning mechanism. The operation of this system will be described in detail hereinafter.

When first, a start button 8h for effecting searching in one direction, for example, in the direction in which the tuning frequency becomes high is operated, a voltage is applied to the base of transistor Tr1 of the search command circuit 8, and the transistor Tr1 is turned ON. Thereby a plunger 14a of the clutch section 14 is energized through a line 25 to actuate the plunger 14a whereby the drive force of the motor 10 is transmitted to the transmission mechanism section 11 and at the same time, a main switch S is closed, which state is self-retained since the one transistor Tr2 of the clutch section 14 is OFF whilst the other tranasistor Tr3 is ON.

On the other hand, when the start button 8h is operated, input ends of first and second gates G1 and G2, respectively, of a clutch circuit 9a constituting the motor driver 9 are held L and H levels, respectively, and output ends thereof are held L and H levels, respectively, and therefore, an output end of a gate G3 of a polarity converter circuit 9b constituting the motor driver 9, and transistor Tr4 base of which is connected to the output end thereof is turned ON, whereby among four transistors Tr5 to Tr8 bridged to the motor 10, transistors Tr5 and Tr7 base potential of which is in H level and which are opposed to each other relative to one diagonal line are turned ON and therefore the motor 10 runs in one direction. The running force of the motor 10 is transmitted to the transmission mechanism section 11, and the transmission mechanism section 11 moves the sliding member 12 to simultaneously vary the variable tuning elements of the antenna circuit 1, the RF amplifier circuit 2 and the local oscillator circuit 7 and at the same time continuously drives them in the direction in which the tuning frequency becomes high. This searching is still maintained because the potential of the output end of the latch circuit 9a is not varied even after the hand of an operator has been disengaged from the start button 8h. When a broadcasting radiowave is caught from a certain station during the time of the searching, a signal of frequency 1 KHz is output from the control circuit 20 as previously mentioned when the intermediate frequency of the output of the IF amplifier circuit 4 in the radio receiving circuit has reached 454 KHz which is lower by 1 KHz than the center frequency 455 KHz of the pass band width of the IF amplifier circuit 4. This signal is inputted into the base of one transistor Tr2 of the clutch section 14 through the detector circuit 24, and the transistor Tr2 is turned ON while the one transistor Tr3 is turned OFF to cut off the enegization to the plunger 14a and the main switch S is also opened. Thus, the driving force of the motor 10 caused by the transmission mechanism section 11 with respect to the variable tuning elements is cut off, and the selection of a station is carried out at an approximately center frequency of the incoming broadcasting radiowave. Further, in FIG. 2, when the strat button 8l is actuated for effecting searching in the other direction, for example, in the direction in which the tuning frequency becomes low, a voltage is applied to the base of transistor Tr1 of the search command circuit 8, and the transistor Tr1 is turned ON whereby the plunger 14a of the clutch section 14 is energized through a line 25a, by which operation the running force of the motor 10 is transmitted to the transmission mechanism section 11 and the main switch S is closed. This state is self-retained since the one transistor Tr2 of the clutch section 14 is OFF while the other transistor Tr3 is ON.

By operating the one start button 8l, input ends of first and second gates G1 and G2, respectively, of the latch circuit 9a constituting the motor driver 9 assume H and L levels, respectively, whereas the outputs assume L and H levels, respectively. Therefore, the output end of gate G3 of the polarity convertor circuit 9b constituting the motor driver 9 assumes H level, and transistor Tr4 base of which is connected to the output end is turned ON, whereby among four transistors Tr5 to Tr8 bridged to the motor 10, transistors Tr6 to Tr8 base potentials of which are in H level and which are opposed to each other relative to the other diagonal line are turned ON, and therefore the motor 10 is driven in the other direction whereby the variable tuning elements are driven to start continuous searching in the direction in which the tuning frequency becomes low. When a broadcasting radiowave is caught from a certain station during the time of the searching, a signal of frequency 1 KHz is output from the control circuit 20 as previously mentioned when the intermediate frequency of output of the IF amplifier ciruciit 4 in the radio receiving circuit reaches the frequency of 456 KHz which is higher by 1 KHz than the center frequency 455 KHz of the IF amplifier circuit 4. Therefore, this signal is input into the base of the one transistor Tr2 of the clutch section 14 through the detector circuit 24, and the transistor Tr2 is turned ON and the other transistor Tr3 is turned OFF to deenergize the plunger 14a and open the main switch S also, whereby all the operation is released and the selection of a station is effected at an approximately center frequency of the incoming broadcasting radiowave.

In the above-described operation, the variable tuning elements are searched in the direction in which the tuning frequency becomes high while varying the elements, and when the sliding member 12 supporting the variable tuning elements assumes its movable threshold position, the sliding member 12 actuates one reverse switch Sh whereby potentials of output ends of the first and second gates G1 and G2, respectively, of the latch circuit 9a are reversed to the L and H levels, respectively, exactly similar to that the other start button 8l is operated, and therefore, the polarity of the motor 10 is also reversed. Then, the variable tuning elements are automatically varied in the direction in which the tuning frequency becomes low.

Alternatively, in the above-described operation, the variable tuning elements are searched in the direction in which the tuning frequency becomes low while varying the elements, and when the sliding member 12 assumes its movable threshold position, the other reverse switch Sl is closed, and potentials of output ends of the first and second gates G1 and G2 of the latch circuit 9a are reversed exactly similar to that the one start button 8h is operated, whereby the running of the motor 10 is also reversed. Then, the variable tuning elements are automatically varied in the direction in which the tuning frequency becomes high.

Further, in the above-described arrangement, when both the start buttons 8h and 8l are erroneously depressed simultaneously, the transistor Tr1 of the search command circuit 8 is turned ON but potentials of input ends of the first and second gates G1 and G2 of the latch circuit 9a assume the L level whereas potentials of output ends assume the H level, and therefore, the potential of the output end of the gate G3 of the polarity converter circuit 9b also assumes the L level. Because of this, transistor Tr4 is turned OFF and even if any one of four bridge-connected transistors Tr5 to Tr8 is in ON position, the motor 10 is not energized. When the variable tuning elements are changed, for example, in the direction in which the tuning frequency is high as the motor 10 runs to cause the sliding member 12 to actuate one reverse switch Sh and even if the start button 8h in the same direction is erroneously depressed, the motor 10 is not energized either since the potentials of input ends of the first and second gates G1 and G2 assume the L level whereas the potentials of the output ends thereof assume the H level.

In the above-described arrangement, as the variable tuning elements of the antenna circuit 1, the RF amplifier circuit 2 and the local oscillator circuit 7, variable inductance elements, variable capacity tuning elements or variable capacity diodes, etc. may be used.

While in the detailed description of the embodiment, the case of the AM radio receiving circuit has been described, it is to be noted that the search tuning mechanism to which the present invention particularly pertains may also be applied to radio receiving circuits of other systems, such as FM, LW, etc.

What is claimed is:

1. A radio receiving circuit with a search tuning mechanism, said radio receiving circuit including an intermediate frequency amplifier circuit, said search tuning mechanism having an inertia which determines an inertia travelling time during which the tuning mechanism travels after suspension of a drive force applied thereto, and including a control circuit which receives a part of an output signal from said intermediate frequency amplifier circuit, said control circuit comprising:
   an oscillator circuit for producing an oscillating output oscillating at a center frequency in a pass band of said intermediate frequency amplifier circuit;
   a mixing circuit for mixing and detecting the oscillating output of said oscillating circuit and the output signal of said intermediate frequency amplifier circuit; and
   a setting circuit which receives an output signal of said mixing circuit and which presets a predetermined amount of variation of frequency or predetermined shift width of frequency relative to the center frequency within the pass band of said intermediate frequency amplifier circuit so that said setting circuit produces an output signal effective to intermittently suspend the application of the drive force according to the output signal of said mixing circuit, said amount of variation of frequency or said shift width of frequency preset by said setting circuit corresponding to the inertia travelling time of said search tuning mechanism.

2. A radio receiving circuit with a search tuning mechanism as set forth in claim 1; further comprising detecting means receptive of the output signal of said setting circuit to control the search tuning mechanism such that the drive force applied to said search tuning mechanism is intermittently suspended by an output of said detecting means.

3. A radio receiving circuit with a search tuning mechanism as set forth in claim 1; wherein said setting circuit presets a predetermined shift width of approximately 1 KHz for an AM radio receiving circuit.

4. A radio receiving circuit with a search tuning mechanism as set forth in claim 1; wherein said setting circuit presets a predetermined shift width of approximately 15 KHz for an FM radio receiving circuit.

5. A radio receiving circuit with a search tuning mechanism as set forth in claim 1; wherein said setting circuit presets a predetermined shift width of approximately 250 Hz for an LW radio receiving circuit.

6. A radio receiving circuit with a search tuning mechanism as set forth in claim 1; wherein said setting circuit adjustably presets a shift width of frequency.

7. A radio receiving circuit with a search tuning mechanism as set forth in claim 1; wherein said setting circuit is provided with a band pass filter.

8. A radio receiving circuit with a search tuning mechanism as set forth in claim 1; wherein said search tuning mechanism includes variable tuning elements composed of at least one of the following three kinds of components a, b and c:
 a. variable inductance elements,
 b. variable capacitors,
 c. variable capacity diodes.

9. In a radio receiver including a search tuning mechanism shiftably driven in response to a drive force applied thereto to frequency-scan broadcast radio signals and having a given inertia which determines an intertia travelling time interval during which the search tuning mechanism travels after suspsension of the applied drive force, and an intermediate frequency amplifier circuit having a pass band and operative during the frequency-scanning of the broadcast radio signals to pass a radio signal having a frequency within the pass band, the improvement comprising: an oscillator circuit for producing a reference signal having a center frequency of the pass band; a mixing circuit for mixing the radio signal passed through the intermediate frequency amplifier circuit and the reference signal to produce a mixed signal; and control means for setting a predetermined shift width of frequency relative to the center frequency corresponding to the inertia travelling time interval and being receptive of the mixed signal for producing a control signal effective to suspend the application of the drive force to the search tuning mechanism when the frequency of the passed radio signal falls within the predetermined shift width to thereby enable the search tuning mechanism to tune the radio signal to the center frequency.

10. A radio receiver according to claim 9; wherein the control means includes a detecting circuit for detecting when the frequency of the passed radio signal falls within the predetermined shift width.

11. A radio receiver according to claim 9; wherein the control means includes a band pass filter for setting a predetermined shift width.

12. A radio receiver according to claim 9; wherein the control means includes means for setting a shift width of approximately 1 KHz for an AM radio signal.

13. A radio receiver according to claim 9; wherein the control means includes means for setting a shift width of approximately 15 KHz for an FM radio signal.

14. A radio receiver according to claim 9; wherein the control means includes means for setting shift width of approximately 250 KHz for an LW radio signal.

* * * * *